United States Patent
Ono et al.

(10) Patent No.: US 9,796,828 B2
(45) Date of Patent: Oct. 24, 2017

(54) EPOXY RESIN COMPOSITION AND ELECTRONIC COMPONENT DEVICE

(71) Applicant: Hitachi Chemical Company, Ltd., Tokyo (JP)

(72) Inventors: Yuta Ono, Yuki (JP); Mitsuaki Fusumada, Yuki (JP); Hironori Kobayashi, Yuki (JP); Yuya Kitagawa, Ibaraki (JP); Teruyoshi Hasegawa, Ibaraki (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 0 days.

(21) Appl. No.: 14/909,557

(22) PCT Filed: Aug. 5, 2013

(86) PCT No.: PCT/JP2013/071185
§ 371 (c)(1),
(2) Date: Feb. 2, 2016

(87) PCT Pub. No.: WO2015/019407
PCT Pub. Date: Feb. 12, 2015

(65) Prior Publication Data
US 2016/0177055 A1    Jun. 23, 2016

(51) Int. Cl.
| | | |
|---|---|---|
| *H01L 23/31* | (2006.01) |
| *H01L 23/29* | (2006.01) |
| *C08K 5/13* | (2006.01) |
| *C08K 5/1539* | (2006.01) |
| *C08K 5/17* | (2006.01) |
| *C08K 5/092* | (2006.01) |
| *C08L 63/00* | (2006.01) |
| *C08K 7/18* | (2006.01) |
| *C08K 5/09* | (2006.01) |
| *C08K 3/00* | (2006.01) |
| *C08K 5/00* | (2006.01) |

(52) U.S. Cl.
CPC .............. *C08K 5/13* (2013.01); *C08K 5/09* (2013.01); *C08K 5/092* (2013.01); *C08K 5/1539* (2013.01); *C08K 5/175* (2013.01); *C08K 7/18* (2013.01); *C08L 63/00* (2013.01); *H01L 23/293* (2013.01); *H01L 23/295* (2013.01); *H01L 23/296* (2013.01); *H01L 23/3107* (2013.01); *C08K 3/0033* (2013.01); *C08K 5/0025* (2013.01); *C08L 2203/206* (2013.01); *C08L 2205/06* (2013.01); *H01L 2924/0002* (2013.01)

(58) Field of Classification Search
CPC ....... H01L 2924/181; H01L 2924/0665; H01L 23/49894; H01L 23/4985; H01L 23/3107; H01L 23/295; H01L 2924/00; H01L 2924/0002; H01L 23/296; H01L 23/293; C08K 5/09; C08K 5/13; C08K 5/1539; C08K 5/092; C08K 7/18; C08K 5/0025; C08K 3/0033; C08L 2203/206; C08L 63/00; C08L 2205/06
See application file for complete search history.

(56) References Cited

U.S. PATENT DOCUMENTS

| | | | |
|---|---|---|---|
| 2011/0221075 A1* | 9/2011 | Meura .................. | B23K 1/0016 257/779 |
| 2013/0026662 A1* | 1/2013 | Iwashige ................. | C08L 61/06 257/788 |

FOREIGN PATENT DOCUMENTS

| | | | | |
|---|---|---|---|---|
| EP | 1074571 A2 | 2/2001 | | |
| JP | S63-225616 A | 9/1988 | | |
| JP | H03-119049 A | 5/1991 | | |
| JP | H05-3269 A | 1/1993 | | |
| JP | 8-92355 | * 4/1996 | ............. | H01L 23/29 |
| JP | 2002-206016 A | 7/2002 | | |
| JP | 2003-160639 A | 6/2003 | | |
| JP | 2005-314567 | * 11/2005 | ............. | H01L 23/29 |
| JP | 2006-36974 A | 2/2006 | | |
| JP | 2012-67177 A | 4/2012 | | |
| JP | 2013-159746 A | 8/2013 | | |

OTHER PUBLICATIONS

Written Opinion of the International Search Authority for PCT/JP2013/071185 dated Aug. 27, 2013 (4 Pages).
International Search Report for PCT/JP2013/071185 dated Aug. 27, 2013; English translation submitted herewith (3 pages).
English language machine translation of JP 2005-314567, 14 pages.
English language machine translation of JP 08-092355, 7 pages.
Extended European Search Report dated Feb. 28, 2017, for European Application 13891005.4.
Office Action dated Jul. 25, 2017 for Japanese Application No. JP 2015-530574, together with English language translation thereof.

* cited by examiner

*Primary Examiner* — Jasmine Clark
(74) *Attorney, Agent, or Firm* — Fitch Even Tabin & Flannery, LLP

(57) ABSTRACT

An epoxy resin composition, comprising an epoxy resin, a curing agent, a curing accelerator, an inorganic filler, and a carboxylic acid compound that satisfies at least one selected from the group consisting of the following A, B and C below: A: having at least one carboxy group and at least one hydroxy group; B: having at least two carboxy groups; and C: having a structure in which two carboxy groups are condensed by dehydration.

12 Claims, No Drawings

EPOXY RESIN COMPOSITION AND ELECTRONIC COMPONENT DEVICE

TECHNICAL FIELD

The present invention relates to an epoxy resin composition and an electronic component device.

BACKGROUND ART

Semiconductor elements such as transistors, integrated circuits (IC), and large scale integrations (LSI) are typically formed into a semiconductor device by encapsulating in a package such as a ceramic package or a plastic package. Ceramic packages have a superior resistance to high-temperature and high-humidity environments and a superior mechanical strength, due to the material thereof being highly resistant with respect to heat and humidity, and are capable of providing highly reliable encapsulation.

However, ceramic packages have problems such as being relatively expensive in material costs and being less suitable for mass production. Therefore, plastic packages, which use a resin for encapsulation, have been becoming predominant. As for the material for encapsulation in plastic packages, an epoxy resin composition has been suitably used due to its excellent heat resistance.

In the fields of automobiles, large home electronic appliances, industrial equipments and other industries, power devices such as transistors, diodes and thyristors are used as semiconductor devices for high-power regulation. These power devices produce a large amount of heat upon being subjected to a high voltage. Therefore, the power devices are provided with a lead frame that exhibits excellent heat radiation, such as a nickel-plated lead frame or an aluminum lead frame. However, these lead frames typically are less adhesive with respect to an encapsulating resin, as compared to a frame made of copper or an alloy such as 42 alloy. As a result, detachment from the encapsulating resin is likely to occur in a package. The detachment tends to decrease heat conductivity in the encapsulating resin and lower the reliability of the device. Against this background, development of a resin composition for encapsulation, which exhibits a favorable adhesion with respect to metallic materials that exhibit poor adhesion with respect to an encapsulating resin, has been demanded.

As an attempt to improve the adhesion of an epoxy resin composition for encapsulating a semiconductor device (hereinafter, also referred to as an "epoxy resin composition") with respect to metallic materials, for example, Japanese Patent Application Laid-Open (JP-A) No. 2002-206016 proposes the use of a specific coupling agent having a thiol group. There are other proposed use of an agent, such as a silane coupling agent having an epoxy group or a silane coupling agent having a vinyl group (see, for example, Japanese Patent Application Laid-Open (JP-A) No. H03-119049).

SUMMARY OF INVENTION

Problems to be Solved by the Invention

However, in the fields of using metallic materials, such as power devices, there is a demand for an epoxy resin composition that exhibits further improved adhesion with respect to metallic materials, as compared to the epoxy resin compositions obtained by the methods as described above.

In view of the above, the invention provides an epoxy resin composition that exhibits excellent adhesion with respect to metallic materials, and an electronic component device in which detachment of an encapsulating resin from a metallic material is suppressed.

Means for Solving the Problems

The method for solving the above problems is as described below.

(1) An epoxy resin composition, comprising an epoxy resin, a curing agent, a curing accelerator, an inorganic filler, and a carboxylic acid compound that satisfies at least one selected from the group consisting of the following A, B, and C:

A: having at least one carboxy group and at least one hydroxy group;
B: having at least two carboxy groups; and
C: having a structure in which two carboxy groups are condensed by dehydration.

(2) The epoxy resin composition according to (1), wherein the carboxylic acid compound has at least one carboxy group and at least one hydroxy group.

(3) The epoxy resin composition according to (1) or (2), wherein the carboxylic acid compound has an aromatic ring.

(4) The epoxy resin composition according to any one of (1) to (3), wherein the carboxylic acid compound has one benzene ring to which two or three hydroxy groups and one carboxy group are bonded.

(5) The epoxy resin composition according to any one of (1) to (4), wherein the carboxylic acid compound comprises gallic acid.

(6) The epoxy resin composition according to any one of (1) to (5), further comprising a silicone compound.

(7) The epoxy resin composition according to any one of (1) to (6), being in the form of a powder or a tablet.

(8) An electronic component device, comprising:
an electronic component; and
a cured product of the epoxy resin composition according to any one of (1) to (7), the cured product encapsulating the electronic component.

Effects of the Invention

According to the invention, an epoxy resin composition that exhibits excellent adhesion with respect to metallic materials, and an electronic component device in which detachment of an encapsulating resin from a metallic material is suppressed, can be provided.

DESCRIPTION OF EMBODIMENTS

The term "process" as used herein encompasses not only an individual process but also a process that is not clearly distinguished from another process, if a desired object of the process is achieved. The numerical range expressed as "from . . . to . . . " indicate a range including the values before and after the "to" as a minimum value and a maximum value. When there are plural substances that correspond to the same component, the content of the component refers to the total content of the substances, unless otherwise specified. The term "layer" as used herein encompasses configurations of partially formed shape, as viewed from the top, in addition to configurations of entirely formed shape.

The epoxy resin composition of the invention includes an epoxy resin, a curing agent, a curing accelerator, an inorganic filler, and a carboxylic acid compound that satisfies at least one selected from the group consisting of the following A, B and C (hereinafter, also referred to as a "specific carboxylic acid compound"):

A: having at least one carboxy group and at least one hydroxy group;

B: having at least two carboxy groups; and

C: having a structure in which two carboxy groups are condensed by dehydration.

The epoxy resin composition of the invention exhibits excellent adhesion with respect to metallic materials by including the specific carboxylic acid compound.

A presumed reason why the epoxy resin composition including the specific carboxylic acid compound exhibits excellent adhesion with respect to metallic materials is that a hydroxy group or a metal atom, or both, existing at a surface of a metallic material such as a lead frame, is chemically bonded with a carboxy group (including a carboxy group that is formed as a result of hydrolyzation of dehydrated and condensed carboxy groups) or a hydroxy group, or both, of the specific carboxylic acid compound. As a result, it is presumed that the adhesion between the epoxy resin composition and the metallic material is enhanced and the adhesion is improved.

The epoxy resin composition, including the specific carboxylic acid compound, exhibits excellent adhesion with respect to metals that are low in adhesion with respect to an epoxy resin composition, such as nickel and aluminum. The composition also exhibits excellent adhesion with respect to other metals such as copper, gold, silver and palladium, and to a resist layer formed on a wiring board or the like.

<Specific Carboxylic Acid Compound>

The epoxy resin composition of the invention includes a carboxylic acid compound that satisfies at least one selected from the group consisting of A, B and C as described above (specific carboxylic acid compound). The specific carboxylic acid compound may be used singly, or in combination of two or more kinds thereof.

The specific carboxylic acid compound may satisfy only one of A, B and C, any two of them, or the three of them. Specifically, the specific carboxylic acid compound may have at least two carboxy groups and at least one hydroxy group (A and B); at least two carboxy groups and a structure in which two carboxy groups are condensed by dehydration (B and C); at least one carboxy group, at least one hydroxy group and a structure in which two carboxy groups are condensed by dehydration (A and C), or at least two carboxy groups, at least one hydroxy group and a structure in which two carboxy groups are condensed by dehydration (A, B and C).

In a case in which the specific carboxylic acid compound has at least one carboxy group and at least one hydroxy group, the number of the carboxy group is not particularly limited as long as it is at least one. The number of the hydroxy group is not particularly limited as long as it is at least one. From the viewpoint of improving the adhesion with respect to metallic materials, the number of the hydroxy group is preferably at least two, more preferably at least three.

In a case in which the specific carboxylic acid compound has at least two carboxy groups, the number of the carboxy group is not particularly limited as long as it is at least two.

In a case in which the specific carboxylic acid compound has a structure in which two carboxy groups are condensed by dehydration, the number of the structure is not particularly limited.

The structure of the specific carboxylic acid compound is not particularly limited. Examples of the structure include an aliphatic carboxylic acid, an aromatic carboxylic acid, and an acid anhydride thereof. The specific carboxylic acid compound may or need not have a substituent other than the carboxy group or the hydroxy group. The type and the number of the substituent are not particularly limited. Specific examples include an alkyl group having 1 to 10 carbon atoms, an alkoxy group having 1 to 10 carbon atoms, an aryl group having 6 to 12 carbon atoms, an aryloxy group having 6 to 12 carbon atoms, a halogen atom, a carbonyl group that may be a ketone group, an amino group and a nitro group.

Examples of the specific carboxylic acid compound having at least one carboxy group and at least one hydroxy group include an aliphatic hydroxy acid that does not have an aromatic ring and derivatives of the aliphatic hydroxy acid, and an aromatic hydroxy acid that has an aromatic ring and derivatives of the aromatic hydroxy acid.

Specific examples of the aliphatic hydroxy acid and derivatives thereof include glycolic acid, lactic acid, tartronic acid, glycerin acid, hydroxybutyric acid, malic acid, tartaric acid, citramalic acid, citric acid, isocitric acid, leucic acid, mevalonic acid, pantoic acid, ricinoleic acid, ricinelaidic acid, cerebronic acid, quinic acid, shikimic acid, N-[(2-hydroxyethyl)imino]diacetic acid, and N,N-di(2-hydroxyethyl)glycine.

Specific examples of the aromatic hydroxy acid and derivatives thereof include a monohydroxybenzoic acid such as salicylic acid (2-hydroxybenzoic acid), 3-hydroxybenzoic acid, 4-hydroxybenzoic acid, creosotic acid, vanillic acid and syringic acid, and derivatives thereof; a dihydroxybenzoic acid such as 2-pyrocatechuic acid (2,3-dihydroxybenzoic acid), β-resorcin acid (2,4-dihydroxybenzoic acid), gentisic acid (2,5-dihydroxybenzoic acid), γ-resorcin acid (2,6-dihydroxybenzoic acid), protocatechuic acid (3,4-dihydroxybenzoic acid), α-resorcin acid (3,5-dihydroxybenzoic acid), 3,6-dihydroxybenzoic acid and orsellinic acid, and derivatives thereof; a trihydroxybenzoic acid such as gallic acid (3,4,5-trihydroxybenzoic acid) and phloroglucinol carboxylic acid (2,4,6-trihydroxybenzoic acid) and derivatives thereof; a phenylacetic acid such as mandelic acid, benzyl acid and atrolactic acid, and derivatives thereof; a hydroxycinnamic acid such as melilotic acid, phloretic acid, coumaric acid, umbellic acid, caffeic acid, ferulic acid and sinapic acid, and derivatives thereof; and an aromatic dicarboxylic acid having at least one hydroxy group such as 5-hydroxyisophthalic acid, 2-hydroxyterephthalic acid and 2,5-dihydroxyterephthalic acid, and derivatives thereof.

Specific examples of the specific carboxylic acid compound having at least two carboxy groups include an aliphatic dicarboxylic acid such as oxalic acid, malonic acid, succinic acid, glutaric acid, adipic acid, pimelic acid, suberic acid, azelaic acid, sebacic acid, maleic acid and fumaric acid, and derivatives thereof; an aromatic dicarboxylic acid such as phthalic acid, isophthalic acid and terephthalic acid, and derivatives thereof; an aromatic polycarboxylic acid such as trimellitic acid, pyromellitic acid, benzenepentacarboxylic acid, and benzenehexacarboxylic acid, and derivatives thereof; and a compound corresponding to the above-described compound having at least one carboxy group and at least one hydroxy group, wherein the number of the carboxy group is at least two.

Specific examples of the specific carboxylic acid compound having a structure in which two carboxy groups are condensed by dehydration include a compound (acid anhydride) having a structure in which two carboxy groups are condensed by dehydration among the above-listed specific carboxylic acid compounds having at least two carboxy groups.

From the viewpoint of suppressing an increase in water absorption, the specific carboxylic acid compound preferably has an aromatic ring. Examples of the aromatic ring include, but are not limited to, a benzene ring, a heterocyclic ring and a fused ring of the aromatic rings. Among these, a compound having a benzene ring or a fused ring thereof is preferred, and a compound having one benzene ring is more preferred.

From the viewpoint of achieving both favorable adhesion with respect to metallic materials and favorable water absorbency, the specific carboxylic acid compound preferably has one benzene ring to which at least one carboxy group (if there are two or more carboxy groups, two of the carboxy groups may be condensed by dehydration) and at least one hydroxy group are bonded. From the viewpoint of improving the adhesion with respect to metallic materials, the total number of the carboxy group and the hydroxy groups that are bonded to the benzene ring is preferably at least three, more preferably at least four. From the viewpoint of suppressing an increase in water absorption, the number of the carboxy group that is bonded to the benzene ring is preferably two or less, more preferably one or less. Therefore, from the viewpoint of the balance between the adhesion and the water absorbency, a compound having one benzene ring to which two to five hydroxy groups and one or two carboxy groups are bonded is preferred (if there are two carboxy groups, two of the carboxy groups may be condensed by dehydration), a compound having one benzene ring to which two or three hydroxy groups and one carboxy group are bonded is more preferred, and a compound having one benzene ring to which three hydroxy groups and one carboxy group are bonded is still more preferred. Among these, gallic acid (3,4,5-trihydroxybenzoic acid) is particularly preferred.

The content of the specific carboxylic acid compound in the epoxy resin composition is not particularly limited. From the viewpoint of sufficiently improving the adhesion of the epoxy resin composition, the content of the specific carboxylic acid compound is preferably determined such that the value calculated by the following equation is 0.01 or more, preferably 0.2 or more, more preferably 0.4 or more, and still more preferably 0.8 or more.

Mass of specific carboxylic acid compound/(mass of epoxy resin+mass of curing agent+mass of curing accelerator)×100

From the viewpoint of suppressing an increase in water absorption of the epoxy resin composition, the content of the specific carboxylic acid compound is preferably determined such that the value calculated by the above equation is 30 or less, preferably 21 or less, more preferably 18 or less, and still more preferably 15 or less.

When the content of the specific carboxylic acid compound satisfies the conditions as described above, a favorable adhesion tends to be achieved while suppressing an increase in water absorption. As a result, reliability of the electronic component device tends to improve. Whether or not the specific carboxylic acid compound exists in the epoxy resin composition can be determined by, for example, nuclear magnetic resonance spectroscopy (NMR) or high-performance liquid chromatography (HPLC).

<Epoxy Resin>

The epoxy resin composition of the invention includes an epoxy resin. The type of the epoxy resin is not particularly limited, and can be selected depending on the intended use. The epoxy resin may be used singly, or in combination of two or more kinds thereof. Specific examples of the epoxy resin include polyfunctional epoxy resins such as dicyclopentadiene epoxy resin, cresol novolac epoxy resin, phenol novolac epoxy resin, naphthalene epoxy resin, bisphenol A epoxy resin, biphenyl epoxy resin, and triphenylmethane epoxy resin.

The epoxy resin to be used in the epoxy resin composition of the invention preferably has a melting point or a softening point that is higher than room temperature (25° C.). In a case in which the epoxy resin composition is used for encapsulating a power device, it is preferable to use an epoxy resin that can allow the epoxy resin composition to have a Tg of 175° C. or higher, after being cured. Examples of the epoxy resin that satisfies the condition as described above include triphenylmethane epoxy resin and cresol novolac epoxy resin. In a case in which the epoxy resin composition is used for encapsulating a ball grid array (BGA), it is preferable to use an epoxy resin that is low in viscosity and water absorption. Examples of the epoxy resin that satisfies the condition as described above include biphenyl epoxy resins.

<Curing Agent>

The epoxy resin composition of the invention includes a curing agent. The type of the curing agent is not particularly limited, and can be selected depending on the intended use. The curing agent may be used singly, or in combination of two or more kinds thereof. Specific examples of the curing agent include polyfunctional phenolic resins such as dicyclopentadiene phenolic resin, phenol novolac resin, cresol novolac resin, phenol aralkyl resin, biphenyl phenolic resin, and triphenylmethane phenolic resin.

The curing agent to be used in the epoxy resin composition of the invention preferably has a melting point or a softening point that is higher than room temperature (25° C.). In a case in which the epoxy resin composition is used for encapsulating a power device, it is preferable to use a curing agent that can allow the epoxy resin composition to have a Tg of 175° C. or higher, after being cured. Examples of the curing agent that satisfies the condition as described above include triphenylmethane phenolic resin and phenol novolac resin.

The ratio of the content of the epoxy resin to the content of the curing agent in the epoxy resin composition is preferably determined such that the content of the curing agent is sufficient to cure the epoxy resin. Specifically, in a case of using a phenolic resin as the curing agent, the ratio is preferably determined such that the hydroxy group equivalent in the phenolic resin per equivalent of epoxy group in the epoxy resin is from 0.6 to 1.5.

<Curing Accelerator>

The epoxy resin composition of the invention includes a curing accelerator. The type of the curing accelerator is not particularly limited, and can be selected depending on the intended use. The curing accelerator may be used singly, or in combination of two or more kinds thereof. Specific examples of the curing accelerator include an organophosphorus compound such as tetraphenylphosphonium tetraphenylborate and triphenylphosphine, an imidazole compound such as 2-methylimidazole and phenylimidazole, and a tertiary amine compound such as 1,8-diazabicyclo(5.4.0)undecene-7 (DBU) and 1,5-diazabicyclo(4.3.0)nonene-5 (DBN). From the viewpoint of curability and adhesion of the epoxy resin composition, an imidazole compound is preferred.

The content of the curing accelerator in the epoxy resin composition is not particularly limited, and can be selected depending on the intended use. From the viewpoint of obtaining a sufficient effect of accelerating the curing, the content of the curing accelerator is preferably determined such that the mass of the curing accelerator, where the mass of the curing agent is 100, is preferably 0.001 or more, more preferably 0.01 or more. From the viewpoint of suppressing changes in color of a cured product of the epoxy resin composition, the mass of the curing accelerator, where the mass of the curing agent is 100, is preferably 15.0 or less, preferably 10.0 or less.

<Inorganic Filler>

The epoxy resin composition of the invention includes an inorganic filler. The type of the inorganic filler is not particularly limited, and can be selected depending on the intended use. The inorganic filler may be used singly, or in combination of two or more kinds thereof.

Specific examples of the inorganic filler include a powder of quartz glass, talc, silica such as fused silica and crystalline silica, alumina, aluminum nitride, and silicon nitride. The inorganic filler to be used in the epoxy resin composition of the invention may be of any state, such as crushed, spherical, or triturated. From the viewpoint of reducing a coefficient of linear expansion of a cured product of the epoxy resin composition, a silica powder is preferred. From the viewpoint of increasing fillability and flowability, a fused silica powder is more preferred. Examples of the fused silica powder include a spherical fused silica powder and a crushed fused silica powder. From the viewpoint of flowability, a spherical fused silica powder is preferred.

The average particle size of the inorganic filler is not particularly limited, and can be selected depending on the intended use. For example, the average particle size of the inorganic filler can be in the range of from 1 µm to 50 µm, and is preferably in the range of from 2 µm to 40 As used herein, the "average particle size of inorganic filler" is defined as an average value determined by laser diffraction/scattering particle size distribution analysis. The average particle size can be determined with, for example, a laser diffraction/scattering particle size distribution analyzer (e.g., LA-920 from HORIBA, Ltd.) and a measurement sample that is randomly taken from the population.

In the epoxy resin composition of the invention, two or more inorganic fillers having different volume average particle sizes may be used in combination. From the viewpoint of improving flowability, for example, an inorganic filler having a volume average particle size in the range of from 1 µm to 50 µm or in the range of from 2 µm to 40 µm and an inorganic filler having a volume average particle size in the range of from 0.5 µm to 2 µm may be used in combination. In a case in which two or more inorganic fillers having different volume average particle sizes are used in combination, the mixing ratio of the inorganic fillers is not particularly limited, and can be selected depending on the intended use.

The content of the inorganic filler in the epoxy resin composition is not particularly limited, and can be selected depending on the intended use. From the viewpoint of reducing the content of organic components in the epoxy resin composition to improve the flame resistance of a cured product, the content of the inorganic filler is preferably 50% by mass or more with respect to the total mass of the epoxy resin composition, more preferably 65% by mass or more. From the viewpoint of suppressing a reduction in flowability of the epoxy resin composition, the content of the inorganic filler is preferably 95% by mass or less with respect to the total mass of the epoxy resin composition, more preferably 92% by mass or less.

<Silicone Compound>

The epoxy resin composition of the invention preferably includes a silicone compound. The silicone compound is a compound that may be used as a stress-reducing agent for the epoxy resin composition. When the epoxy resin composition includes the specific carboxylic acid compound and the silicone compound, adhesion of the epoxy resin composition tends to further improve.

The silicone compound is a high molecular compound having, as a main backbone, a siloxane bond to which an organic group is bonded, and organic polysiloxane compounds that are commonly used can be used without any particular limitation.

Specific examples of the silicone compound include dimethylpolysiloxane, methylhydrogenpolysiloxane, both-end hydrogenmethylpolysiloxane, methylphenylpolysiloxane, alkyl-modified polysiloxane, amino-modified polysiloxane, carboxyl-modified polysiloxane, epoxy-modified polysiloxane, epoxy/polyether-modified polysiloxane, alcohol-modified polysiloxane, polyether-modified polysiloxane, higher fatty acid-modified polysiloxane, vinyl group-containing polysiloxane, alkyl/polyether-modified polysiloxane, alkyl/aralkyl/polyether-modified polysiloxane, fluorine-modified polysiloxane, mercapto-modified polysiloxane, chloroalkyl-modified polysiloxane, and (meth)acryloyl-modified polysiloxane. The silicone compound may be used singly, or in combination of two or more kinds thereof. The silicone compound may be obtained as an industrial product or a reagent that is commercially available, or may be synthesized by a known method. The molecular weight of the silicone compound is not particularly limited, and can be selected depending on the intended use.

The content of the silicone compound in the epoxy resin composition is not particularly limited, and can be selected depending on the intended use. From the viewpoint of obtaining sufficiently low stress properties and sufficient adhesion, the mass of the silicone compound, where the total mass of the epoxy resin, the curing agent and the curing accelerator is 100, is preferably 1.0 or more, more preferably 2.0 or more. From the viewpoint of suppressing an increase in water absorption, the mass of the silicone compound, where the total mass of the epoxy resin, the curing agent, and the curing accelerator is 100, is preferably 20.0 or less, more preferably 15.0 or less. Whether or not the silicone compound exists in the epoxy resin composition can be determined by, for example, nuclear magnetic resonance spectroscopy (NMR) or a Fourier transform infrared spectroscopy (FT-IR).

<Other Components>

The epoxy resin composition of the invention may include components other than the components as described above, as necessary. Specific examples of the other components include a mold release agent, a stress-reducing agent other than the silicone compound, a flame retardant, a pigment, an ion-trapping agent, a coupling agent, and a heat stabilizer.

The type of the mold release agent is not particularly limited, and can be selected depending on the intended use. Examples of the mold release agent include a higher fatty acid, a higher fatty acid ester, and a higher fatty acid calcium. More specific examples include carnauba wax and polyethylene wax. The mold release agent may be used singly, or in combination of two or more kinds thereof.

The type of the stress-reducing agent is not particularly limited, and can be selected depending on the intended use. Examples of the stress-reducing agent include a butadiene rubber such as a methyl acrylate-butadiene-styrene copolymer and a methyl methacrylate-butadiene-styrene copolymer, and the silicone compounds as described above. The stress-reducing agent may be used singly, or in combination of two or more kinds thereof. The inclusion of the stress-reducing agent tends to improve adhesiveness. In particular, inclusion of a silicone compound as a stress-reducing agent tends to improve both of low-stress properties and adhesion.

The type of the flame retardant is not particularly limited, and can be selected depending on the intended use. Examples of the flame retardant include an organophosphorus compound, antimony oxide, and a metal hydroxide such as aluminum hydroxide and magnesium hydroxide. The flame retardant may be used singly, or in combination of two or more kinds thereof.

The type of the pigment is not particularly limited, and can be selected depending on the intended use. Examples of the pigment include carbon black. The inclusion of carbon black tends to impart an electrostatic-eliminating effect. The pigment may be used singly, or in combination of two or more kinds thereof.

The type of the ion-trapping agent is not particularly limited, and can be selected depending on the intended use. The inclusion of the ion-trapping agent tends to improve the reliability in terms of a moisture resistance reliability test. Examples of the ion-trapping agent include a hydrotalcite compound and bismuth hydroxide. The ion-trapping agent may be used singly, or in combination of two or more kinds thereof.

The type of the coupling agent is not particularly limited, and can be selected depending on the intended use. Examples of the coupling agent include a silane coupling agent such as 3-mercaptopropyltrimethoxysilane and 3-glycidoxypropyltrimethoxysilane. The coupling agent may be used singly, or in combination of two or more kinds thereof.

The type of the heat stabilizer is not particularly limited, and can be selected depending on the intended use. Examples of the heat stabilizer include a maleimide compound and a cyanate ester resin. The heat stabilizer may be used singly, or in combination of two or more kinds thereof.

In the invention, the maleimide compound refers to a compound having two or more maleimide groups in one molecule. Specific examples of the maleimide compound include a compound represented by the following Formulas (1) to (3).

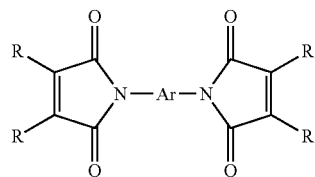
(1)

In Formula (1), Ar represents a divalent group including an aromatic ring, and R represents a hydrogen atom, an alkyl group having 1 to 4 carbon atoms, an alkoxy group having 1 to 4 carbon atoms, or —$CF_3$. Specific examples of the structure of the divalent group represented by Ar include the following structures.

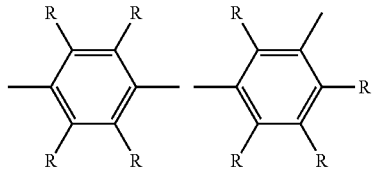

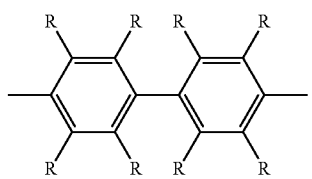

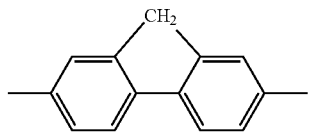

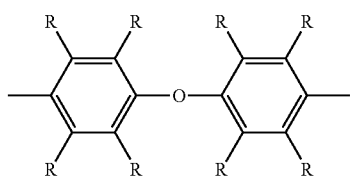

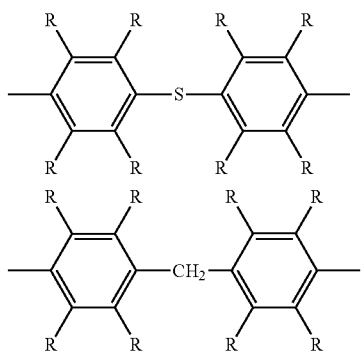

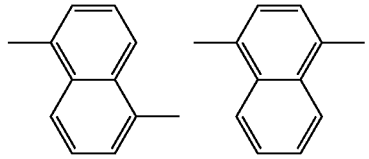

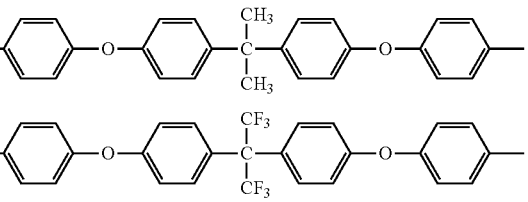

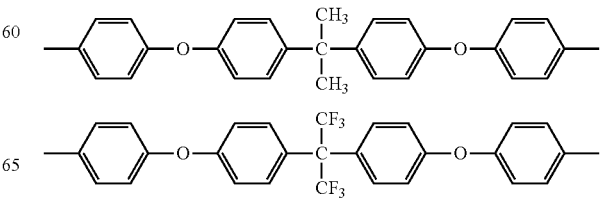

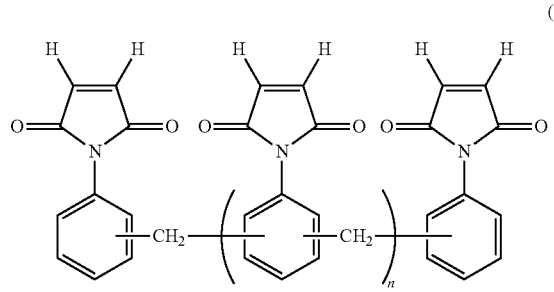

(2)

In Formula (2), n is 0 or a positive number.

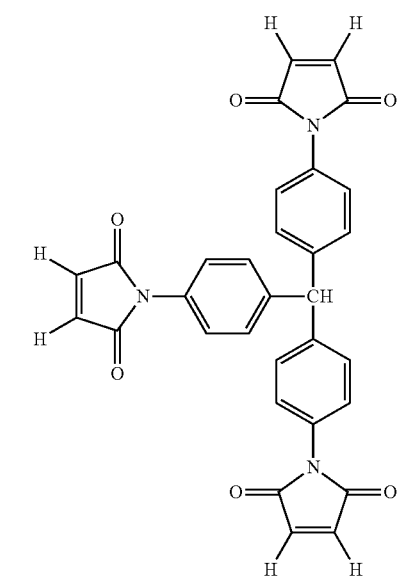

(3)

The cyanate ester resin is not particularly limited, and can be selected depending on the intended use. Specific examples of the cyanate ester resin include a cyanate ester resin having a novolac backbone, such as a phenol novolac cyanate ester and a cresol novolac cyanate esters (e.g., a cyanate ester resin represented by the following Formula (4)); a divalent cyanate ester resin such as bis(3,5-dimethyl-4-cyanatephenyl)methane, bis(4-cyanatephenyl)methane, bis(3-methyl-4-cyanatephenyl)methane, bis(3-ethyl 4-cyanatephenyl)methane, bis(4-cyanatephenyl)-1,1-ethane, bis(4-cyanatephenyl)-2,2-propane, di(4-cyanatephenyl) ether, di(4-cyanatephenyl) thioether, 4,4'-{1,3-phenylenebis(1-methylethylidene)}biphenyl cyanate, and 2,2-bis(4-cyanatephenyl)-1,1,1,3,3,3-hexafluoropropane; a trivalent cyanate ester resin, such as tris(4-cyanatephenyl)-1,1,1-ethane and bis(3,5-dimethyl-4-cyanatephenyl)-4-cyanatephenyl-1,1,1-ethane; and a polyvalent cyanate ester oligomer resin, i.e., a partially trimerized compounds of the cyanate ester resin as described above. The cyanate ester resin may be in a state of a liquid or a solid, and can be selected depending on the intended use.

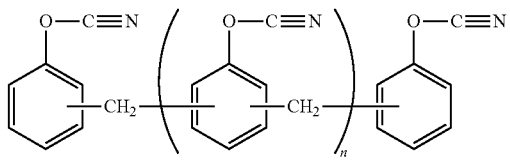

(4)

In Formula (4), n is an integer from 2 to 10.

The content of the heat stabilizer in the epoxy resin composition is not particularly limited, and can be selected depending on the intended use. Whether or not the heat stabilizer exists in the epoxy resin composition can be determined by, for example, nuclear magnetic resonance spectroscopy (NMR) or a Fourier transform infrared spectroscopy (FT-IR).

<Method of Producing Epoxy Resin Composition>

The epoxy resin composition of the invention can be produced by, for example, a method as described below. Specifically, a specific carboxylic acid compound, an epoxy resin, a curing agent, a curing accelerator, an inorganic filler, and, if necessary, other components are mixed by an ordinary method, and blended with a powder mixer. Then, the blend is melt-kneaded while heating with, for example, a mixing roll or an extrusion kneader. Thereafter, the resultant is solidified by cooling at room temperature, thereby obtaining an epoxy resin composition. The epoxy resin composition may be crushed by a known means into a powder having a desired particle size, and the powder may be formed into tablets of a desired shape. The particle size of the powder and the size of the tablet are not particularly limited, and can be selected depending on the intended use.

<Electronic Component Device>

The electronic component device of the invention includes an electronic component and a cured product of the epoxy resin composition of the invention, and the cured product encapsulates the electronic component. The electronic component device of the invention has excellent reliability, because the electronic component is encapsulated with the epoxy resin composition of the invention.

The epoxy resin composition of the invention exhibits excellent adhesion with respect to metallic materials. Therefore, the effect of the invention is more significant in a case in which an electronic component including a metallic material is encapsulated. Examples of the electronic component including a metallic material include electronic components that include a member that is made of metal or plated with metal. Specific examples thereof include a lead frame that is made of aluminum or has a surface treated by nickel electroplating or electroless nickel plating, to which conventional encapsulants could not exhibit sufficient adhesion.

The method of encapsulating an electronic component with the epoxy resin composition of the invention is not particularly limited, and can be selected depending on the intended use. For example, encapsulation can be performed by a known molding method such as transfer molding. Examples of the electronic component device include ICs, LSIs, and power devices.

EXAMPLES

In the following, the invention will be described with reference to the Examples. However, the invention is not limited thereto.

Examples 1 to 49 and Comparative Examples 1 to 4

Components as described below were mixed at a ratio shown in Tables 1 to 4 (% by mass) at room temperature (25° C.), and melt-kneaded with a roll kneader that was heated at from 80° C. to 150° C. Then, the molten product was cooled to room temperature and an epoxy resin composition in a solid state was obtained. The epoxy resin composition was crushed to obtain a powder. The powder was formed into tablets having a truncated cone shape.

<Specific Carboxylic Acid Compound>
Specific carboxylic acid compound 1: trimellitic anhydride
Specific carboxylic acid compound 2: oxalic acid
Specific carboxylic acid compound 3: maleic acid
Specific carboxylic acid compound 4: gallic acid
Specific carboxylic acid compound 5: 5-hydroxyisophthalic acid
Specific carboxylic acid compound 6: 2-hydroxybenzoic acid
Specific carboxylic acid compound 7: 3-hydroxybenzoic acid
Specific carboxylic acid compound 8: 4-hydrozybenzoic acid
Specific carboxylic acid compound 9: 2,4-dihydroxybenzoic acid
Specific carboxylic acid compound 10: 2,5-dihydroxybenzoic acid
Specific carboxylic acid compound 11: 2,6-dihydroxybenzoic acid
Specific carboxylic acid compound 12: 3,4-dihydroxybenzoic acid
Specific carboxylic acid compound 13: 3,5-dihydroxybenzoic acid
Specific carboxylic acid compound 14: tartaric acid
Specific carboxylic acid compound 15: citric acid
Specific carboxylic acid compound 16: malic acid
Specific carboxylic acid compound 17: N-(2-hydroxyethyl)iminodiacetic acid
Specific carboxylic acid compound 18: N,N-di(2-hydroxyethyl)glycine
<Carboxylic Acid Ester for Comparison>
Carboxylic acid ester 1: methyl gallate
Carboxylic acid ester 2: ethyl gallate
Carboxylic acid ester 3: propyl gallate
<Epoxy Resin>
Epoxy resin 1: triphenylmethane epoxy resin (epoxy equivalent: 169, melting point: 60° C.)
Epoxy resin 2: dicyclopentadiene epoxy resin (epoxy equivalent: 258, melting point: 60° C.)
Epoxy resin 3: cresol novolac epoxy resin (epoxy equivalent: 200, melting point: 65° C.)
Epoxy resin 4: biphenyl epoxy resin (epoxy equivalent: 193, melting point: 105° C.)
<Curing Agent>
Curing agent 1: phenol novolac resin (hydroxy group equivalent: 105, melting point: 83° C.)
Curing agent 2: phenol aralkyl resin (hydroxy group equivalent: 170, melting point: 62° C.)
Curing agent 3: triphenylmethane phenol resin (hydroxy group equivalent: 97, melting point: 111° C.)
<Curing Accelerator>
Curing accelerator 1: 1,5-diazabicyclo[4.3.0]non-5-ene
Curing accelerator 2: 2-phenyl-4-methyl-5-hydroxymethylimidazole
Curing accelerator 3: tetraphenylphosphonium tetraphenylborate (Hokko Chemical Industry Co. Ltd., TPP-K)
<Inorganic Filler>
Fused spherical silica
<Silicone Compound>
Silicone compound 1: epoxy/polyether-modified silicone oil (Dow Corning Toray Co., Ltd., SF8421EG)
Silicone compound 2: epoxy/polyether-modified silicone oil (Dow Corning Toray Co., Ltd., BY16-876)
<Mold Release Agent>
Mold release agent 1: carnauba wax
Mold release agent 2: oxidized polyethylene wax (acid value: 17)
<Pigment>
Carbon black
<Flame Retardant>
Aluminum hydroxide
<Coupling Agent>
(3-mercaptopropyl)trimethoxysilane
<Heat Stabilizer>
Heat stabilizer 1: 2,2-bis[4-(4-aminophenoxy)phenyl]propane (Daiwakasei Industry Co., Ltd., BMI-4000)
Heat stabilizer 2: maleimide compound of Formula (2) in which n is 0.35 (Daiwakasei Industry Co., Ltd., BMI-2300)
Heat stabilizer 3: cyanate ester resin of Formula (4) in which n is 2 to 10 (Lonza Japan, PT-60)
Heat stabilizer 4: bis(3,5-dimethyl-4-cyanatephenyl)methane (Lonza Japan, BA-3000)

Adhesion with respect to a lead frame and water absorbency of the epoxy resin compositions prepared in the Examples and the Comparative Examples were measured and evaluated in accordance with the following methods. The results are shown in Tables 1 to 4.

<Adhesion with Respect to Lead Frame>
A lead frame with electrolytic nickel plating (lead frame 1), a lead frame with electroless nickel plating (lead frame 2) and a lead frame made of aluminum (A6063) (lead frame 3) were cut into a size of approximately 8 mm×8 mm to prepare a chip, respectively. The chip was sandwiched between a special mold, and the epoxy resin composition prepared in the Example or the Comparative Example was molded on the chip, thereby preparing a test piece. The molding was performed at a temperature of 175° C. for 120 seconds, at a clamp pressure of 1962 MPa and a transfer pressure of 686.7 MPa. Further, post curing was performed by heating the test piece after the molding at 175° C. for 5 hours. Thereafter, the shear adhesion (MPa) of the epoxy resin composition with respect to the chip was measured with a bond tester (Dage Japan Co. Ltd., Dage 4000). The temperature of the measurement table during the measurement was set at 25° C. The measurement was performed 6 times using 6 test pieces for each lead frame, respectively. The average values of the 6 measurements are shown in Tables 1 to 4.

<Water Absorbency>

A test piece having a disc shape of 5 cm in diameter and 1 mm in thickness was prepared by molding the tablets of the epoxy resin compositions prepared in the Examples and the Comparative Examples with a pressing machine (Toho International Inc., TF15). The molding was performed at a temperature of 175° C. for 120 seconds, at a clamp pressure of 1962 MPa and a transfer pressure of 686.7 MPa. Further, post curing was performed by heating the test piece after the molding at 175° C. for 5 hours.

Thereafter, the test piece was dried in a drier at a temperature of 105° C. for 1 hour, and the mass of the test piece when the temperature became room temperature (25° C.) was measured (mass before the water absorption). Subsequently, the test piece was allowed to absorb water at a temperature of 121° C. and a humidity of 100% for 48 hours, and the mass was measured (mass after the water absorption).

(Water Absorbency)

The water absorbency (%) was calculated from the mass before the water absorption and the mass after the water absorption of the test piece, by the following formula. The results are shown in Tabled 1 to 4.

Water absorbency (%)=(mass after the water absorption−mass before the water absorption/(mass before the water absorption)×100

(Rate of Change in Water Absorbency)

The rate of change in water absorbency of the test piece was calculated by the following formula. The value is based on the water absorbency of the test piece prepared in Comparative Example 1, in which a specific carboxylic acid compound was not used.

Rate of change=100−(water absorbency/water absorbency of Comparative Example 1×100)

TABLE 1

| | | | Examples | | | | | | | | | | | | |
|---|---|---|---|---|---|---|---|---|---|---|---|---|---|---|---|
| | | | 1 | 2 | 3 | 4 | 5 | 6 | 7 | 8 | 9 | 10 | 11 | 12 | 13 |
| A | Specific carboxylic acid compound | 1 | 0.032 | 0.049 | 0.08 | 0.16 | 0.41 | 0.81 | 1.21 | 1.62 | 2.02 | 2.43 | | | |
| | | 2 | | | | | | | | | | | 0.41 | | |
| | | 3 | | | | | | | | | | | | 0.41 | |
| | | 4 | | | | | | | | | | | | | 0.03 |
| | | 5 | | | | | | | | | | | | | |
| | | 6 | | | | | | | | | | | | | |
| | | 7 | | | | | | | | | | | | | |
| | | 8 | | | | | | | | | | | | | |
| | | 9 | | | | | | | | | | | | | |
| | | 10 | | | | | | | | | | | | | |
| | | 11 | | | | | | | | | | | | | |
| | | 12 | | | | | | | | | | | | | |
| | | 13 | | | | | | | | | | | | | |
| | | 14 | | | | | | | | | | | | | |
| | | 15 | | | | | | | | | | | | | |
| | | 16 | | | | | | | | | | | | | |
| | | 17 | | | | | | | | | | | | | |
| | | 18 | | | | | | | | | | | | | |
| | Carboxylic acid ester | 1 | | | | | | | | | | | | | |
| | | 2 | | | | | | | | | | | | | |
| | | 3 | | | | | | | | | | | | | |
| B | Epoxy resin | 1 | 9.676 | 9.666 | 9.65 | 9.61 | 9.43 | 9.20 | 8.98 | 8.75 | 8.52 | 8.30 | 9.43 | 9.43 | 9.68 |
| | | 2 | | | | | | | | | | | | | |
| | | 3 | | | | | | | | | | | | | |
| | | 4 | | | | | | | | | | | | | |
| C | Curing agent | 1 | 5.963 | 5.957 | 5.95 | 5.90 | 5.84 | 5.66 | 5.48 | 5.30 | 5.12 | 4.95 | 5.84 | 5.84 | 5.96 |
| | | 2 | | | | | | | | | | | | | |
| | | 3 | | | | | | | | | | | | | |
| D | Curing accelerator | 1 | 0.157 | 0.157 | 0.16 | 0.16 | 0.16 | 0.16 | 0.16 | 0.16 | 0.16 | 0.16 | 0.16 | 0.16 | 0.16 |
| | | 2 | | | | | | | | | | | | | |
| | | 3 | | | | | | | | | | | | | |
| E | Silicone compound | 1 | | | | | | | | | | | | | |
| | | 2 | | | | | | | | | | | | | |
| F | Inorganic filler | | 73.26 | 73.26 | 73.26 | 73.26 | 73.26 | 73.26 | 73.26 | 73.26 | 73.26 | 73.26 | 73.26 | 73.26 | 73.26 |
| G | Flame retardant | | 9.72 | 9.72 | 9.72 | 9.72 | 9.72 | 9.72 | 9.72 | 9.72 | 9.72 | 9.72 | 9.72 | 9.72 | 9.72 |
| H | Mold release agent | 1 | 0.25 | 0.25 | 0.25 | 0.25 | 0.25 | 0.25 | 0.25 | 0.25 | 0.25 | 0.25 | 0.25 | 0.25 | 0.25 |
| | | 2 | 0.08 | 0.08 | 0.08 | 0.08 | 0.08 | 0.08 | 0.08 | 0.08 | 0.08 | 0.08 | 0.08 | 0.08 | 0.08 |
| I | Pigment | | 0.60 | 0.60 | 0.60 | 0.60 | 0.60 | 0.60 | 0.60 | 0.60 | 0.60 | 0.60 | 0.60 | 0.60 | 0.60 |
| J | Coupling agent | | 0.26 | 0.26 | 0.26 | 0.26 | 0.26 | 0.26 | 0.26 | 0.26 | 0.26 | 0.26 | 0.26 | 0.26 | 0.26 |
| K | Heat stabilizer | 1 | | | | | | | | | | | | | |
| | | 2 | | | | | | | | | | | | | |
| | | 3 | | | | | | | | | | | | | |
| | | 4 | | | | | | | | | | | | | |
| | A/(B + C + D) × 100 | | 0.21 | 0.31 | 0.51 | 1.03 | 2.63 | 5.39 | 8.31 | 11.40 | 14.67 | 18.13 | 2.63 | 2.63 | 0.21 |
| | Adhesion (lead frame) | 1 | 1.9 | 2.0 | 2.3 | 3.0 | 5.2 | 9.3 | 9.5 | 11.2 | 12.1 | 15.0 | 4.0 | 2.2 | 1.5 |
| | | 2 | 1.5 | 1.5 | 2.0 | 2.3 | 5.2 | 6.7 | 7.6 | 10.0 | 9.8 | 11.0 | 3.9 | 2.0 | 1.3 |
| | | 3 | 2.8 | 3.5 | 4.0 | 4.7 | 5.0 | 8.6 | 9.8 | 10.2 | 12.0 | 13.5 | 3.5 | 2.8 | 3.2 |
| | Water absorbency (%) | | 0.72 | 0.81 | 0.86 | 0.89 | 0.98 | 1.01 | 1.03 | 1.05 | 1.06 | 1.14 | 1.15 | 1.15 | 0.71 |
| | Rate of change in water absorbency (%) | | 2.8 | 13.6 | 18.6 | 21.3 | 28.6 | 30.7 | 32.0 | 33.3 | 34.0 | 38.6 | 39.1 | 39.1 | 1.4 |

TABLE 2

| | | | Examples | | | | | | | | | | | | | |
|---|---|---|---|---|---|---|---|---|---|---|---|---|---|---|---|---|
| | | | 14 | 15 | 16 | 17 | 18 | 19 | 20 | 21 | 22 | 23 | 24 | 25 | 26 | 27 |
| A | Specific carboxylic acid compound | 1 | | | | | | | | | | | | | | |
| | | 2 | | | | | | | | | | | | | | |
| | | 3 | | | | | | | | | | | | | | |
| | | 4 | 0.08 | 0.16 | 0.41 | 0.41 | 0.41 | 0.41 | 1.21 | 1.21 | 1.62 | 2.43 | 0.41 | 0.41 | 0.41 | 0.41 |
| | | 5 | | | | | | | | | | | | | | |
| | | 6 | | | | | | | | | | | | | | |
| | | 7 | | | | | | | | | | | | | | |
| | | 8 | | | | | | | | | | | | | | |
| | | 9 | | | | | | | | | | | | | | |
| | | 10 | | | | | | | | | | | | | | |
| | | 11 | | | | | | | | | | | | | | |
| | | 12 | | | | | | | | | | | | | | |
| | | 13 | | | | | | | | | | | | | | |
| | | 14 | | | | | | | | | | | | | | |
| | | 15 | | | | | | | | | | | | | | |
| | | 16 | | | | | | | | | | | | | | |
| | | 17 | | | | | | | | | | | | | | |
| | | 18 | | | | | | | | | | | | | | |
| | Carboxylic acid ester | 1 | | | | | | | | | | | | | | |
| | | 2 | | | | | | | | | | | | | | |
| | | 3 | | | | | | | | | | | | | | |
| B | Epoxy resin | 1 | 9.65 | 9.61 | 9.43 | 9.43 | 8.93 | 8.93 | 8.98 | 8.57 | 8.75 | 8.30 | | | | 10.50 |
| | | 2 | | | | | | | | | | | | | 11.32 | |
| | | 3 | | | | | | | | | | | 10.35 | | | |
| | | 4 | | | | | | | | | | | | 9.30 | | |
| C | Curing agent | 1 | 5.95 | 5.90 | 5.84 | 5.84 | 5.53 | 5.53 | 5.48 | 5.08 | 5.30 | 4.95 | 4.80 | | 3.50 | |
| | | 2 | | | | | | | | | | | | 5.37 | | |
| | | 3 | | | | | | | | | | | | | | 4.68 |
| D | Curing accelerator | 1 | 0.16 | 0.16 | 0.16 | | | | 0.16 | 0.16 | 0.16 | 0.16 | | | | |
| | | 2 | | | | 0.16 | 0.15 | 0.15 | | | | | | | 0.60 | 0.24 |
| | | 3 | | | | | | | | | | | 0.27 | 0.75 | | |
| E | Silicone compound | 1 | | | | | 0.81 | | | 0.81 | | | | | | |
| | | 2 | | | | | | 0.81 | | | | | | | | |
| F | Inorganic filler | | 73.26 | 73.26 | 73.26 | 73.26 | 73.26 | 73.26 | 73.26 | 73.26 | 73.26 | 73.26 | 73.26 | 73.26 | 73.26 | 73.26 |
| G | Flame retardant | | 9.72 | 9.72 | 9.72 | 9.72 | 9.72 | 9.72 | 9.72 | 9.72 | 9.72 | 9.72 | 9.72 | 9.72 | 9.72 | 9.72 |
| H | Mold release agent | 1 | 0.25 | 0.25 | 0.25 | 0.25 | 0.25 | 0.25 | 0.25 | 0.25 | 0.25 | 0.25 | 0.25 | 0.25 | 0.25 | 0.25 |
| | | 2 | 0.08 | 0.08 | 0.08 | 0.08 | 0.08 | 0.08 | 0.08 | 0.08 | 0.08 | 0.08 | 0.08 | 0.08 | 0.08 | 0.08 |
| I | Pigment | | 0.60 | 0.60 | 0.60 | 0.60 | 0.60 | 0.60 | 0.60 | 0.60 | 0.60 | 0.60 | 0.60 | 0.60 | 0.60 | 0.60 |
| J | Coupling agent | | 0.26 | 0.26 | 0.26 | 0.26 | 0.26 | 0.26 | 0.26 | 0.26 | 0.26 | 0.26 | 0.26 | 0.26 | 0.26 | 0.26 |
| K | Heat stabilizer | 1 | | | | | | | | | | | | | | |
| | | 2 | | | | | | | | | | | | | | |
| | | 3 | | | | | | | | | | | | | | |
| | | 4 | | | | | | | | | | | | | | |
| A/(B + C + D) × 100 | | | 0.51 | 1.03 | 2.63 | 2.63 | 2.77 | 2.77 | 8.31 | 8.80 | 11.40 | 18.13 | 2.66 | 2.66 | 2.66 | 2.66 |
| Adhesion (lead frame) | | 1 | 2.3 | 3.2 | 4.6 | 7.0 | 8.0 | 7.6 | 10.3 | 12.0 | 12.5 | 15.6 | 5.0 | 8.1 | 7.1 | 6.9 |
| | | 2 | 2.0 | 3.1 | 4.4 | 6.5 | 8.4 | 8.0 | 7.5 | 9.8 | 9.4 | 12.0 | 5.1 | 6.7 | 6.0 | 6.6 |
| | | 3 | 4.0 | 4.7 | 10.2 | 10.0 | 10.4 | 10.6 | 22.1 | 24.5 | 25.4 | 27.1 | 8.5 | 12.2 | 9.5 | 12.2 |
| Water absorbency (%) | | | 0.72 | 0.72 | 0.73 | 0.73 | 0.76 | 0.76 | 0.75 | 0.76 | 0.78 | 0.93 | 0.70 | 0.52 | 0.61 | 0.76 |
| Rate of change in water absorbency (%) | | | 2.2 | 2.8 | 3.6 | 3.6 | 7.4 | 7.4 | 6.7 | 8.0 | 10.3 | 24.7 | 0.0 | −34.6 | −14.8 | 7.9 |

TABLE 3

| | | | Examples | | | | | | | | | | | | |
|---|---|---|---|---|---|---|---|---|---|---|---|---|---|---|
| | | | 28 | 29 | 30 | 31 | 32 | 33 | 34 | 35 | 36 | 37 | 38 | 39 | 40 |
| A | Specific carboxylic acid compound | 1 | | | | | | | | | | | | | |
| | | 2 | | | | | | | | | | | | | |
| | | 3 | | | | | | | | | | | | | |
| | | 4 | | | | | | | | | | | | | |
| | | 5 | 0.41 | | | | | | | | | | | | |
| | | 6 | | 0.41 | | | | | | | | | | | |
| | | 7 | | | 0.41 | | | | | | | | | | |
| | | 8 | | | | 0.41 | | | | | | | | | |
| | | 9 | | | | | 0.41 | | | | | | | | |
| | | 10 | | | | | | 0.41 | | | | | | | |
| | | 11 | | | | | | | 0.41 | | | | | | |
| | | 12 | | | | | | | | 0.41 | | | | | |
| | | 13 | | | | | | | | | 0.41 | | | | |
| | | 14 | | | | | | | | | | 0.16 | | | |
| | | 15 | | | | | | | | | | | 0.16 | | |

TABLE 3-continued

|  |  |  | Examples | | | | | | | | | | | | | |
|---|---|---|---|---|---|---|---|---|---|---|---|---|---|---|---|
|  |  |  | 28 | 29 | 30 | 31 | 32 | 33 | 34 | 35 | 36 | 37 | 38 | 39 | 40 |
|  |  | 16 |  |  |  |  |  |  |  |  |  |  |  | 0.16 |  |
|  |  | 17 |  |  |  |  |  |  |  |  |  |  |  |  | 0.16 |
|  |  | 18 |  |  |  |  |  |  |  |  |  |  |  |  |  |
|  | Carboxylic acid ester | 1 |  |  |  |  |  |  |  |  |  |  |  |  |  |
|  |  | 2 |  |  |  |  |  |  |  |  |  |  |  |  |  |
|  |  | 3 |  |  |  |  |  |  |  |  |  |  |  |  |  |
| B | Epoxy resin | 1 | 9.43 | 9.43 | 9.43 | 9.43 | 9.43 | 9.43 | 9.43 | 9.43 | 9.43 | 9.61 | 9.61 | 9.61 | 9.61 |
|  |  | 2 |  |  |  |  |  |  |  |  |  |  |  |  |  |
|  |  | 3 |  |  |  |  |  |  |  |  |  |  |  |  |  |
|  |  | 4 |  |  |  |  |  |  |  |  |  |  |  |  |  |
| C | Curing agent | 1 | 5.84 | 5.84 | 5.84 | 5.84 | 5.84 | 5.84 | 5.84 | 5.84 | 5.84 | 5.90 | 5.90 | 5.90 | 5.90 |
|  |  | 2 |  |  |  |  |  |  |  |  |  |  |  |  |  |
|  |  | 3 |  |  |  |  |  |  |  |  |  |  |  |  |  |
| D | Curing accelerator | 1 | 0.16 | 0.16 | 0.16 | 0.16 | 0.16 | 0.16 | 0.16 | 0.16 | 0.16 | 0.16 | 0.16 | 0.16 | 0.16 |
|  |  | 2 |  |  |  |  |  |  |  |  |  |  |  |  |  |
|  |  | 3 |  |  |  |  |  |  |  |  |  |  |  |  |  |
| E | Silicon compound | 1 |  |  |  |  |  |  |  |  |  |  |  |  |  |
|  |  | 2 |  |  |  |  |  |  |  |  |  |  |  |  |  |
| F | Inorganic filler |  | 73.26 | 73.26 | 73.26 | 73.26 | 73.26 | 73.26 | 73.26 | 73.26 | 73.26 | 73.26 | 73.26 | 73.26 | 73.26 |
| G | Flame retardant |  | 9.72 | 9.72 | 9.72 | 9.72 | 9.72 | 9.72 | 9.72 | 9.72 | 9.72 | 9.72 | 9.72 | 9.72 | 9.72 |
| H | Mold release agent | 1 | 0.25 | 0.25 | 0.25 | 0.25 | 0.25 | 0.25 | 0.25 | 0.25 | 0.25 | 0.25 | 0.25 | 0.25 | 0.25 |
|  |  | 2 | 0.08 | 0.08 | 0.08 | 0.08 | 0.08 | 0.08 | 0.08 | 0.08 | 0.08 | 0.08 | 0.08 | 0.08 | 0.08 |
| I | Pigment |  | 0.60 | 0.60 | 0.60 | 0.60 | 0.60 | 0.60 | 0.60 | 0.60 | 0.60 | 0.60 | 0.60 | 0.60 | 0.60 |
| J | Coupling agent |  | 0.26 | 0.26 | 0.26 | 0.26 | 0.26 | 0.26 | 0.26 | 0.26 | 0.26 | 0.26 | 0.26 | 0.26 | 0.26 |
| K | Heat stabilizer | 1 |  |  |  |  |  |  |  |  |  |  |  |  |  |
|  |  | 2 |  |  |  |  |  |  |  |  |  |  |  |  |  |
|  |  | 3 |  |  |  |  |  |  |  |  |  |  |  |  |  |
|  |  | 4 |  |  |  |  |  |  |  |  |  |  |  |  |  |
| A/(B + C + D) × 100 |  |  | 2.63 | 2.63 | 2.63 | 2.63 | 2.63 | 2.63 | 2.63 | 2.63 | 2.63 | 1.03 | 1.03 | 1.03 | 1.03 |
| Adhesion (lead frame) |  | 1 | 4.2 | 3.0 | 0.0 | 3.3 | 4.0 | 3.9 | 3.7 | 3.4 | 3.8 | 5.0 | 4.1 | 6.8 | 4.5 |
|  |  | 2 | 3.5 | 2.6 | 2.2 | 3.0 | 3.2 | 2.8 | 3.1 | 3.1 | 2.9 | 5.1 | 7.1 | 7.5 | 6.9 |
|  |  | 3 | 2.5 | 2.0 | 1.9 | 2.3 | 3.2 | 2.0 | 2.7 | 1.8 | 2.0 | 6.0 | 4.6 | 6.3 | 7.0 |
| Water absorbency (%) |  |  | 0.80 | 0.74 | 0.72 | 0.72 | 0.71 | 0.75 | 0.75 | 0.75 | 0.73 | 0.98 | 0.99 | 0.98 | 0.93 |
| Rate of change in water absorbency (%) |  |  | 12.5 | 5.7 | 2.6 | 2.6 | 1.4 | 6.7 | 6.7 | 6.7 | 4.1 | 28.6 | 29.3 | 28.6 | 24.7 |

TABLE 4

|  |  |  | Examples | | | | | | | | | Comparative Examples | | | |
|---|---|---|---|---|---|---|---|---|---|---|---|---|---|---|---|
|  |  |  | 41 | 42 | 43 | 44 | 45 | 46 | 47 | 48 | 49 | 1 | 2 | 3 | 4 |
| A | Specific carboxylic acid compound | 1 |  |  |  |  |  |  |  | 0.02 | 3.24 |  |  |  |  |
|  |  | 2 |  |  |  |  |  |  |  |  |  |  |  |  |  |
|  |  | 3 |  |  |  |  |  |  |  |  |  |  |  |  |  |
|  |  | 4 |  | 0.41 | 0.41 | 0.41 | 0.41 | 0.02 | 3.24 |  |  |  |  |  |  |
|  |  | 5 |  |  |  |  |  |  |  |  |  |  |  |  |  |
|  |  | 6 |  |  |  |  |  |  |  |  |  |  |  |  |  |
|  |  | 7 |  |  |  |  |  |  |  |  |  |  |  |  |  |
|  |  | 8 |  |  |  |  |  |  |  |  |  |  |  |  |  |
|  |  | 9 |  |  |  |  |  |  |  |  |  |  |  |  |  |
|  |  | 10 |  |  |  |  |  |  |  |  |  |  |  |  |  |
|  |  | 11 |  |  |  |  |  |  |  |  |  |  |  |  |  |
|  |  | 12 |  |  |  |  |  |  |  |  |  |  |  |  |  |
|  |  | 13 |  |  |  |  |  |  |  |  |  |  |  |  |  |
|  |  | 14 |  |  |  |  |  |  |  |  |  |  |  |  |  |
|  |  | 15 |  |  |  |  |  |  |  |  |  |  |  |  |  |
|  |  | 16 |  |  |  |  |  |  |  |  |  |  |  |  |  |
|  |  | 17 |  |  |  |  |  |  |  |  |  |  |  |  |  |
|  |  | 18 | 0.16 |  |  |  |  |  |  |  |  |  |  |  |  |
|  | Carboxylic acid ester | 1 |  |  |  |  |  |  |  |  |  | 0.41 |  |  |  |
|  |  | 2 |  |  |  |  |  |  |  |  |  |  | 0.41 |  |  |
|  |  | 3 |  |  |  |  |  |  |  |  |  |  |  |  | 0.41 |
| B | Epoxy resin | 1 | 9.61 | 4.72 | 4.72 | 4.72 | 4.72 | 9.67 | 7.84 | 9.67 | 7.84 | 9.72 | 9.43 | 9.43 | 9.43 |
|  |  | 2 |  |  |  |  |  |  |  |  |  |  |  |  |  |
|  |  | 3 |  |  |  |  |  |  |  |  |  |  |  |  |  |
|  |  | 4 |  |  |  |  |  |  |  |  |  |  |  |  |  |
| C | Curing agent | 1 | 5.90 | 2.92 | 2.92 | 2.92 | 2.92 | 5.98 | 4.59 | 5.98 | 4.59 | 6.02 | 5.84 | 5.84 | 5.84 |
|  |  | 2 |  |  |  |  |  |  |  |  |  |  |  |  |  |
|  |  | 3 |  |  |  |  |  |  |  |  |  |  |  |  |  |
| D | Curing accelerator | 1 | 0.16 |  |  |  |  | 0.16 | 0.16 | 0.16 | 0.16 | 0.09 | 0.16 | 0.16 | 0.16 |
|  |  | 2 |  | 0.08 | 0.08 | 0.08 | 0.08 |  |  |  |  |  |  |  |  |
|  |  | 3 |  |  |  |  |  |  |  |  |  |  |  |  |  |

TABLE 4-continued

| | | | Examples | | | | | | | | | Comparative Examples | | | |
|---|---|---|---|---|---|---|---|---|---|---|---|---|---|---|---|
| | | | 41 | 42 | 43 | 44 | 45 | 46 | 47 | 48 | 49 | 1 | 2 | 3 | 4 |
| E | Silicone compound | 1 | | | | | | | | | | | | | |
| | | 2 | | | | | | | | | | | | | |
| F | Inorganic filler | | 73.26 | 73.26 | 73.26 | 73.26 | 73.26 | 73.26 | 73.26 | 73.26 | 73.26 | 73.26 | 73.26 | 73.26 | 73.26 |
| G | Flame retardant | | 9.72 | 9.72 | 9.72 | 9.72 | 9.72 | 9.72 | 9.72 | 9.72 | 9.72 | 9.72 | 9.72 | 9.72 | 9.72 |
| H | Mold release agent | 1 | 0.25 | 0.25 | 0.25 | 0.25 | 0.25 | 0.25 | 0.25 | 0.25 | 0.25 | 0.25 | 0.25 | 0.25 | 0.25 |
| | | 2 | 0.08 | 0.08 | 0.08 | 0.08 | 0.08 | 0.08 | 0.08 | 0.08 | 0.08 | 0.08 | 0.08 | 0.08 | 0.08 |
| I | Pigment | | 0.60 | 0.60 | 0.60 | 0.60 | 0.60 | 0.60 | 0.60 | 0.60 | 0.60 | 0.60 | 0.60 | 0.60 | 0.60 |
| J | Coupling agent | | 0.26 | 0.26 | 0.26 | 0.26 | 0.26 | 0.26 | 0.26 | 0.26 | 0.26 | 0.26 | 0.26 | 0.26 | 0.26 |
| K | Heat stabilizer | 1 | 7.71 | | | | | | | | | | | | |
| | | 2 | | 7.71 | | | | | | | | | | | |
| | | 3 | | | 7.71 | | | | | | | | | | |
| | | 4 | | | | 7.71 | | | | | | | | | |
| A/(B + C + D) × 100 | | | 1.03 | 5.25 | 5.25 | 5.25 | 5.25 | 0.10 | 25.73 | 0.10 | 25.73 | 0.00 | 2.63 | 2.63 | 2.63 |
| Adhesion (lead frame) | | 1 | 6.1 | 5.0 | 4.9 | 7.0 | 8.2 | 0.6 | 16.2 | 0.8 | 10.2 | 0.0 | 0.1 | 0.1 | 0.1 |
| | | 2 | 7.0 | 4.8 | 5.0 | 6.9 | 7.0 | 0.6 | 15.0 | 0.7 | 10.3 | 0.0 | 0.0 | 0.0 | 0.0 |
| | | 3 | 8.1 | 11.0 | 10.5 | 13.0 | 15.2 | 1.2 | 27.5 | 0.8 | 12.0 | 0.0 | 1.0 | 0.9 | 0.3 |
| Water absorbency (%) | | | 0.97 | 0.68 | 0.70 | 0.65 | 0.64 | 0.71 | 1.16 | 0.74 | 1.20 | 0.70 | 0.71 | 0.72 | 0.72 |
| Rate of change in water absorbency (%) | | | 27.8 | −2.9 | 0.0 | −7.7 | −9.4 | 1.4 | 39.7 | 5.4 | 41.7 | Ref. | 1.4 | 2.8 | 2.8 |

From the measurement results as described above, it is found that the epoxy resin compositions prepared in the Examples exhibit a high adhesion with respect to any of lead frames 1 to 3.

The epoxy resin compositions prepared in Examples 13 to 36 and 42 to 47, in which a compound having a structure in which at least one carboxy group and at least one hydroxy group are bonded to a benzene ring is used, exhibit superior results both in the adhesion with respect to a lead frame and the rate of change in water absorbency, among the specific carboxylic acid compounds. It is also found that the epoxy resin composition in which gallic acid is used exhibits significantly superior results both in the adhesion with respect to a lead frame and the rate of change in water absorbency. Further, it is found that the adhesion with respect to a lead frame can be further improved by adding a silicone compound, while suppressing the rate of change in water absorbency.

The epoxy resin composition of Comparative Example 1, which does not include a specific carboxylic acid compound, does not exhibit adhesion with respect to any of lead frames 1 to 3. The epoxy resin compositions of Comparative Examples 2 to 4, which include a carboxylic acid ester instead of a specific carboxylic acid compound, do not exhibit sufficient adhesion with respect to a lead frame.

In view of the above, the epoxy resin composition is suitable for encapsulation of a power device or the like, which uses a metallic material, and for production of a highly reliable semiconductor device.

The invention claimed is:

1. An epoxy resin composition, comprising an epoxy resin, a curing agent, a curing accelerator, an inorganic filler, and a carboxylic acid compound that satisfies at least one selected from the group consisting of:
   A: having at least one carboxy group and at least three hydroxy groups; and
   B: having a structure in which two carboxy groups are condensed by dehydration.

2. The epoxy resin composition according to claim 1, wherein the carboxylic acid compound has an aromatic ring.

3. The epoxy resin composition according to claim 1, wherein the carboxylic acid compound comprises gallic acid.

4. The epoxy resin composition according to claim 1, further comprising a silicone compound.

5. The epoxy resin composition according to claim 1, being in the form of a powder or a tablet.

6. An electronic component device, comprising:
   an electronic component; and
   a cured product of the epoxy resin composition according to claim 1, the cured product encapsulating the electronic component.

7. The epoxy resin composition according to claim 1, the epoxy resin comprising at least one selected from a dicyclopentadiene epoxy resin, a cresol novolac epoxy resin, a phenol novolac epoxy resin, a naphthalene epoxy resin, a bisphenol A epoxy resin, a biphenyl epoxy resin, and a triphenylmethane epoxy resin.

8. The epoxy resin composition according to claim 1, the curing agent comprising at least one selected from a dicyclopentadiene phenolic resin, a phenol novolac resin, a cresol novolac resin, a phenol aralkyl resin, a biphenyl phenolic resin, and a triphenylmethane phenolic resin.

9. The epoxy resin composition according to claim 1, the curing accelerator comprising at least one selected from an organophosphorus compound, an imidazole compound, and a tertiary amine compound.

10. The epoxy resin composition according to claim 1, the inorganic filler comprising at least one selected from quartz glass, talc, silica, alumina, aluminum nitride, and silicon nitride.

11. The epoxy resin composition according to claim 1, a content of the carboxylic acid compound being 0.01 or more and 30 or less, when calculated from the following formula:

[mass of the carboxylic acid compound/(mass of the epoxy resin+mass of the curing agent+mass of the curing accelerator)]×100.

12. The epoxy resin composition according to claim 1, a content of the carboxylic acid compound being 2.63 or more and 25.73 or less, when calculated from the following formula:

[mass of the carboxylic acid compound/(mass of the epoxy resin+mass of the curing agent+mass of the curing accelerator)]×100.

* * * * *